(12) United States Patent
Haji et al.

(10) Patent No.: US 7,964,449 B2
(45) Date of Patent: *Jun. 21, 2011

(54) METHOD FOR MANUFACTURING SEMICONDUCTOR CHIP AND METHOD FOR PROCESSING SEMICONDUCTOR WAFER

(75) Inventors: Hiroshi Haji, Fukuoka (JP); Kiyoshi Arita, Fukuoka (JP)

(73) Assignee: Panasonic Corporation, Osaka (JP)

( * ) Notice: Subject to any disclaimer, the term of this patent is extended or adjusted under 35 U.S.C. 154(b) by 150 days.

This patent is subject to a terminal disclaimer.

(21) Appl. No.: 12/373,813

(22) PCT Filed: Aug. 24, 2007

(86) PCT No.: PCT/JP2007/066960
§ 371 (c)(1),
(2), (4) Date: Jan. 14, 2009

(87) PCT Pub. No.: WO2008/023849
PCT Pub. Date: Feb. 28, 2008

(65) Prior Publication Data
US 2010/0055875 A1    Mar. 4, 2010

(30) Foreign Application Priority Data

Aug. 24, 2006 (JP) ................ P2006-227647

(51) Int. Cl.
H01L 21/00    (2006.01)
(52) U.S. Cl. .. 438/113; 438/114; 438/463; 257/E21.499
(58) Field of Classification Search .................... 438/33, 438/68, 113, 114, 458, 460, 463; 257/E21.499
See application file for complete search history.

(56) References Cited

U.S. PATENT DOCUMENTS

| 6,642,127 | B2 * | 11/2003 | Kumar et al. | 438/460 |
| 6,908,784 | B1 * | 6/2005 | Farnworth et al. | 438/106 |
| 7,767,551 | B2 * | 8/2010 | Arita et al. | 438/460 |
| 2004/0102025 | A1 * | 5/2004 | Arita | 438/460 |
| 2006/0024924 | A1 * | 2/2006 | Haji et al. | 438/464 |

FOREIGN PATENT DOCUMENTS

| JP | 2003-209096 A | 7/2003 |
| JP | 2005-191039 A | 7/2005 |
| WO | 03/028949 A2 | 4/2003 |

OTHER PUBLICATIONS

International Search Report for PCT/JP2007/066960.

* cited by examiner

Primary Examiner — Khiem D Nguyen
(74) Attorney, Agent, or Firm — Pearne & Gordon LLP

(57) ABSTRACT

In a laser processing step S3, boundary sections among semiconductor elements 2 of a resist film 4 are exposed to a laser beam 13a, to thus form in the resist film 4 boundary grooves 5—which partition the semiconductor elements 2 from each other—and to uncover a surface 1b of a semiconductor wafer 1 in the boundary grooves 5. In a plasma etching step S6, the surface 1b of the semiconductor wafer 1 exposed in the boundary grooves 5 is etched by means of plasma Pf of a fluorine-based gas, to thus separate the semiconductor wafer 1 into individual semiconductor chips 1' along the boundary grooves 5. Between the laser processing step S3 and the plasma etching step S6, there is performed processing pertaining to a boundary-groove-surface smoothing step S5 for smoothing, by means of plasma Po of oxygen gas, surfaces of the boundary grooves 5 having assumed an irregular shape in the laser processing step S3.

8 Claims, 6 Drawing Sheets

METHOD FOR MANUFACTURING SEMICONDUCTOR CHIP AND METHOD FOR PROCESSING SEMICONDUCTOR WAFER

TECHNICAL FIELD

The present invention relates to a semiconductor chip manufacturing method for manufacturing semiconductor chips by means of slicing a semiconductor wafer-in which a plurality of semiconductor elements are fabricated-by means of plasma etching, as well as to a semiconductor wafer processing method.

BACKGROUND ART

A semiconductor wafer has become thin to a thickness of the order of tens of micrometers, and it is necessary to handle the semiconductor wafer so as to avoid external forces, such as bending, warpage, a physical impact, or the like, as much as possible during the course of processing or transportation. In a dicing process for dicing a semiconductor wafer into individual semiconductor chips, adoption of a mechanical dicing method using a circular blade, or the like, has hitherto been common. However, a method called plasma dicing which enables lessening of damage to a wafer resulting from mechanical dicing has recently been proposed. Plasma dicing is a technique for: forming in a resist film boundary grooves which partition semiconductor elements from each other, by means of exposure-transfer, through a mask, of a dicing pattern onto the resist film formed on one surface of a semiconductor wafer, thereby forming, in a resist film, boundary grooves while partition semiconductor elements off from each other; and eliminating the uncovered surface of the semiconductor wafer in the boundary grooves by means of plasma etching, to thus dice the semiconductor wafer into individual semiconductor chips along the boundary grooves.

There has also been put forth a method for radiating a laser beam onto areas corresponding to boundary grooves-which will be formed by means of a dicing pattern-instead of forming a dicing pattern through exposure-transfer (Patent Document 1). Since this method obviates the necessity for an expensive exposure transfer system, plasma dicing can be performed at low cost.

[Patent Document 1] JP-A-2005-191039

DISCLOSURE OF THE INVENTION

However, the surfaces of the boundary grooves formed in the resist film by means of radiation of the laser beam is not smooth but assumes a scored, sharply-pointed, irregular shape. Such a shape of the surfaces of the boundary grooves is formed as a result of the resist film having been cut by means of a pulsating laser beam, to thus create irregularities on a cut surface of the resist film, or as a result of residues splashed around surroundings adhering to the surfaces of the boundary grooves. When the wafer is subjected to plasma etching while the surfaces of the boundary grooves still remains scored and irregular as mentioned above, to thus dice the wafer into individual semiconductor chips, side surfaces of the diced semiconductor chips also assume scored shapes. When minute irregularities on the side surface of the semiconductor chip; namely, so-called chippings, undergo external forces, stress concentration tends to arise. Cracks open in the point where stress concentration has occurred, thereby raising a problem of the semiconductor chip being susceptible to break.

Accordingly, an object of the present invention is to provide a semiconductor chip manufacturing method and a semiconductor wafer processing method which enable manufacture of a chipping-free, hard-to-crack semiconductor chip.

A method for manufacturing a semiconductor chip comprises: a resist film formation step of forming a resist film on one surface of a semiconductor wafer in which a plurality of semiconductor elements are fabricated; a laser processing step of emitting a laser beam to boundary sections among the semiconductor elements of the resist film, to thus form in the resist film boundary grooves which partition the semiconductor elements from each other and to uncover a surface of the semiconductor surface in the boundary grooves; and a plasma etching step of etching the uncovered surface of the semiconductor wafer in the boundary grooves by means of plasma of fluorine-based gas, to thus separate the semiconductor wafer into individual semiconductor chips along boundary grooves of the semiconductor wafer, wherein there is performed, after the laser processing step and before the plasma etching step, processing pertaining to a boundary-groove-surface smoothing step for smoothing the surfaces of the boundary grooves having assumed an irregular shape in the laser processing step by means of plasma of oxygen gas or plasma of gas mixture containing oxygen as a primary ingredient.

Additionally, in the boundary-groove-surface smoothing step, irregularities on the surfaces of the boundary grooves are removed through use of plasma of oxygen gas or plasma of gas mixture containing oxygen as a primary ingredient.

Additionally, in the boundary-groove-surface smoothing step, residues of the resist film adhering to the surfaces of the boundary grooves are removed through use of the plasma of oxygen gas or the plasma of the gas mixture containing oxygen as a primary ingredient.

Additionally, in the boundary-groove-surface smoothing step, irregularities on the surfaces of the boundary grooves are smoothened through use of the plasma of oxygen gas or the plasma of the gas mixture containing oxygen as a primary ingredient, to thus make greater a period between the irregularities.

Moreover, processing pertaining to a resist film elimination step for eliminating the resist film through use of the plasma of oxygen gas or the plasma of the gas mixture containing oxygen as a primary ingredient is performed subsequent to the plasma etching step.

Moreover, the resist film is formed on a surface of the semiconductor wafer opposite to its circuit pattern formation surface in which the semiconductor elements are fabricated.

A method for processing a semiconductor wafer comprises: a resist film formation step of forming a resist film on one surface of a semiconductor wafer in which a plurality of semiconductor elements are fabricated; a laser processing step of emitting a laser beam to boundary sections among the semiconductor elements of the resist film, to thus form in the resist film boundary grooves which partition the semiconductor elements from each other and to uncover a surface of the semiconductor surface in the boundary grooves; a wafer-carrying-in step of transporting the semiconductor wafer having undergone processing pertaining to the laser processing step into a vacuum chamber of a plasma processing system; a boundary-groove-surface smoothing step of smoothing the surfaces of the boundary grooves having assumed an irregular shape in the laser processing step, by means of plasma of oxygen gas or plasma of gas mixture containing oxygen as a primary ingredient; a plasma etching step of etching, subsequent to the boundary-groove-surface-smoothing step, the uncovered surface of the semiconductor wafer in the boundary grooves by means of plasma of fluorine-based gas, to thus separate the semiconductor wafer into individual semiconductor chips along boundary grooves of the semiconductor wafer; and a wafer-carrying-out step of transporting the semiconductor wafer having undergone processing pertaining to the plasma etching step from the vacuum chamber.

Additionally, processing pertaining to a resist film elimination step of eliminating the resist film through use of plasma of oxygen gas or plasma of gas mixture containing oxygen as a primary ingredient, which is generated in the vacuum chamber, is performed between the plasma etching step and the wafer-carrying-out step.

According to the present invention, a laser beam is emitted to boundary sections among semiconductor elements of a resist film, to thus create, in the resist film, boundary grooves which partition the semiconductor elements from each other. After a surface of a semiconductor wafer has been uncovered in the boundary grooves, the semiconductor wafer is subjected to etching through use of plasma of fluorine-based gas, thereby separating the semiconductor wafer into individual semiconductor chips along the boundary grooves. However, the surfaces of the boundary grooves which have assumed the irregular shape in the laser processing step are smoothed by means of the plasma of oxygen gas or the plasma of a gas mixture containing oxygen as a principal ingredient before the semiconductor wafer is subjected to etching by means of the plasma of fluorine-based gas. Therefore, the cut surface of the semiconductor wafer created through plasma etching; namely, side surfaces of separated semiconductor chips, can be smoothed. The chipping-free, hard-to-crack semiconductor chips be obtained.

BEST MODE FOR IMPLEMENTING THE INVENTION

An embodiment of the present invention will be described hereunder by reference to the drawings.

First, the configuration of a laser processing system 10 and a plasma processing system 30, which are used for implementing the semiconductor chip manufacturing method according to the embodiment of the present invention, will be described by reference to FIGS. 1 and 2.

Figure 1:
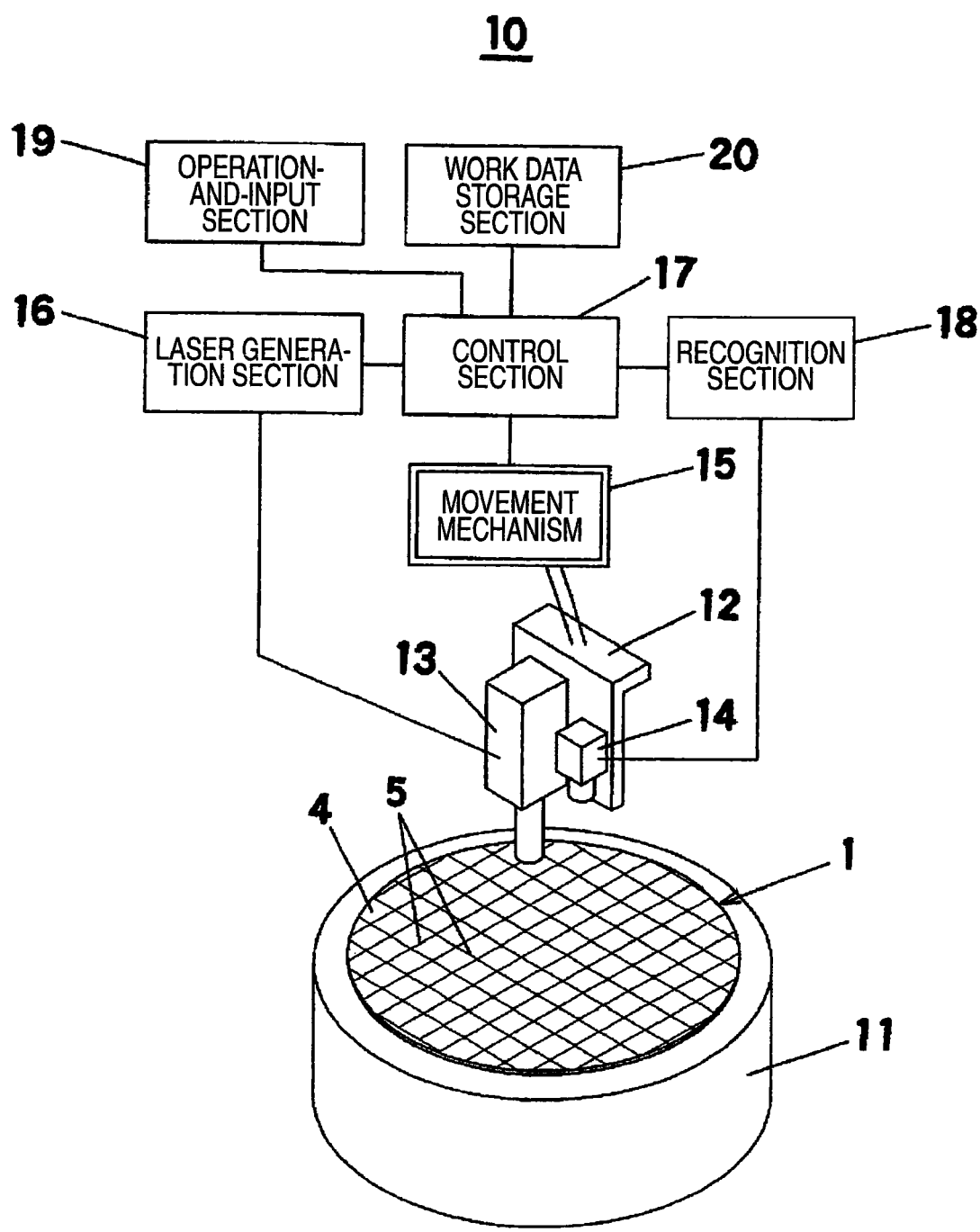
FIG. 1 is a perspective view of a laser processing system used for implementing a semiconductor chip manufacturing method according to an embodiment of the present invention.

In FIG. 1, the laser processing system 10 comprises a wafer holding section 11 for holding in a horizontal position a semiconductor wafer 1 which is an object of processing; a moving plate 12 provided in a movable manner at an elevated position above the wafer holding section 11; a laser emission section 13 and a camera 14 which are fixed to the moving plate 12; a movement mechanism 15 for moving the moving plate 12; a laser generation section 16 for causing the laser emission section 13 to generate a laser beam; a control section 17 for controlling driving of the movement mechanism 15 and generation of a laser beam performed by the laser generation section 16; a recognition section 18 for recognizing the position of the semiconductor wafer 1 from an image captured by the camera 14; an operation-and-input section 19 for imparting an operation signal or an input signal to the control section 17; and the like.

A fixing-and-holding tool, such as a vacuum chuck or the like, for fixing and holding the semiconductor wafer 1 is provided on an upper surface of the wafer holding section 1. The semiconductor wafer 1 is fixed and held while a surface of the wafer to be subjected to laser processing (a surface provided with a resist film 4 to be described later) is oriented upwardly. The moving plate 12 is moved and controlled by means of the control section 17 by way of the movement mechanism 15. The laser emission section 13 and the camera 14 which are fixed to the moving plate 12 are three-dimensionally moved in the space above the semiconductor wafer 1. The laser generation section 16 is controlled by the control section 17, to thus cause the laser emission section 13 to generate a laser beam. The laser emission section 13 emits the thus-generated laser beam downwardly. The camera 14 captures an image of the semiconductor wafer 1 located immediately below the camera by means of infrared light. The recognition section 18 recognizes the position of the semiconductor wafer 1 from the image captured by the camera 14 and transmits to the control section 17 positional information about the semiconductor wafer 1 acquired from the result of positional recognition. The control section 17 ascertains a positional relationship between the semiconductor wafer 1 and the laser emission section 13 from the positional information about the semiconductor wafer 1 transmitted from the recognition section 18, and computes a position (a target position) exposed to a laser beam 13a emitted from the laser emission section 13. In response to an operator's operation, the operation-and-input section 19 provides the control section 17 with an operation signal for the movement mechanism 15, an input signal pertaining to operation of the laser generation section 16, and the like.

Figure 2:
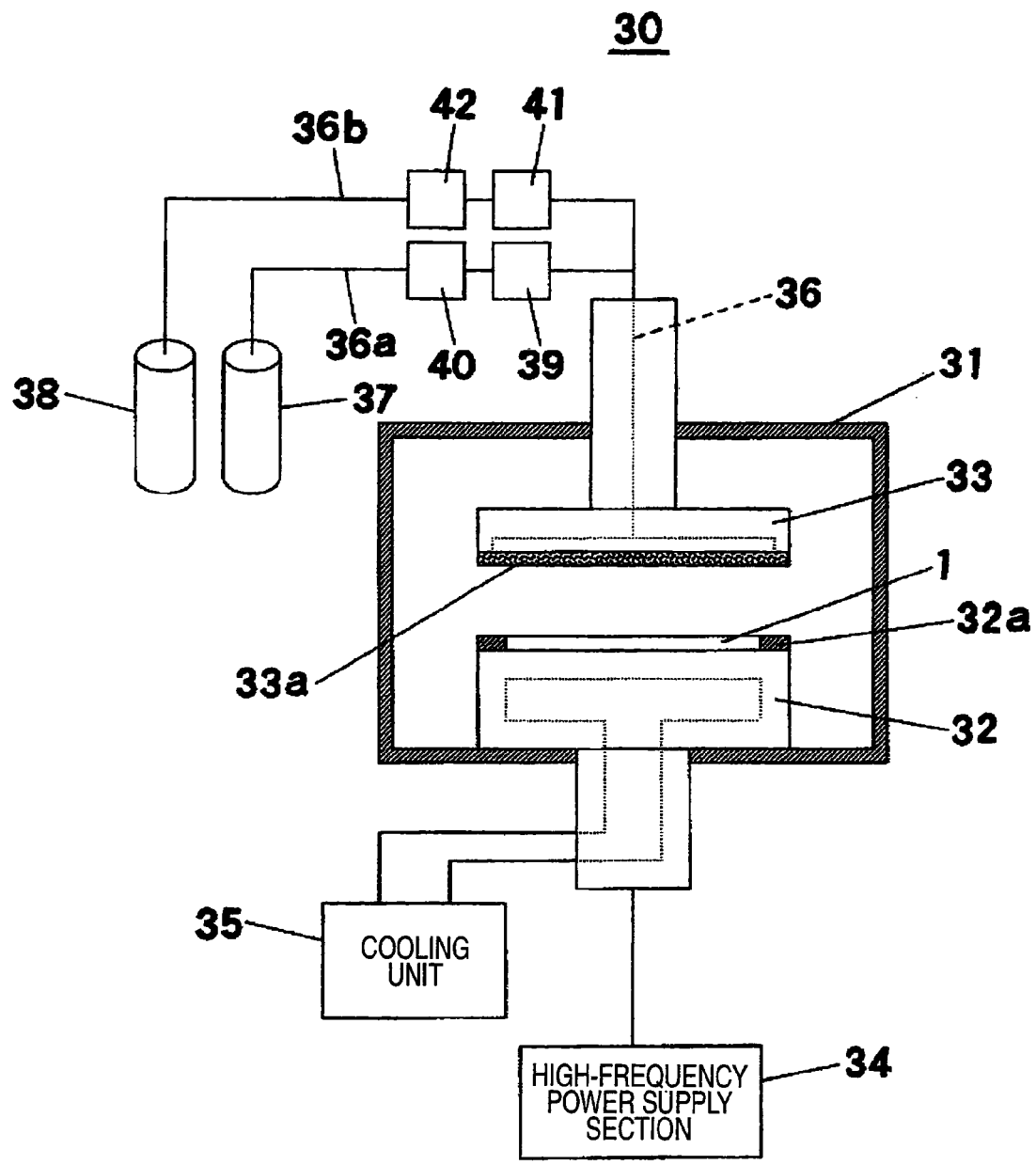
FIG. 2 is a cross-sectional view of a plasma processing system used for implementing the semiconductor chip manufacturing method according to the embodiment of the present invention.

In FIG. 2, the plasma processing system 30 comprises a vacuum chamber 31; a lower electrode 32 and an upper electrode 33 which are provided in the vacuum chamber 31; a high-frequency power supply section 34 for applying a high-frequency voltage to the lower electrode 32; a cooling unit 35 for circulating a coolant through the lower electrode 32; a gas supply channel 36 which extends from the inside of the upper electrode 33 to the outside of the vacuum chamber 31 and which is bifurcated outside of the vacuum chamber 31; an oxygen gas supply section 37 connected to one of branch channels (hereinafter taken as a "first branch channel 36a") of the bifurcated gas supply channel 36; a fluorine-based gas supply section 38 connected to the other branch channel of the bifurcated gas supply channel 36 (hereinafter taken as a "second branch channel 36b"); a first on-off valve 39 and a first flow control valve 40 which are disposed at any positions along the first branch channel 36a; and a second on-off valve 41 and a second flow control valve 42 which are disposed at any positions along the second branch channel 36b.

The inside of the vacuum chamber 31 is an enclosed space where the semiconductor wafer 1 is to be subjected to plasma processing. The lower electrode 32 is set in the vacuum chamber 31 while the surface of the lower electrode 32—which holds the semiconductor wafer 1—is oriented upwardly. The lower surface of the upper electrode 33 is provided at a position above the lower electrode 32 so as to oppose the upper surface of the upper electrode 32.

The upper surface of the lower electrode 32 is provided with a wafer holding mechanism (not shown) formed from a vacuum chuck, an electrostatic suction mechanism, and the like, and a ring-shaped frame 32a formed from an electrical insulating material. The surface of the semiconductor wafer 1 to be subjected to plasma processing is oriented upwardly and supported in such a way that the circumference of the wafer is enclosed by the frame 32a. Thus, the semiconductor wafer 1 is fixed on the upper surface of the lower electrode 32 by means of the wafer holding mechanism.

The oxygen gas supply section 37 is filled with an oxygen gas (which may also be a gas mixture containing oxygen as a primary component). When the first on-off valve 39 is opened (the second on-off valve 41 is closed), the oxygen gas is supplied to the upper electrode 33 by way of the first branch channel 36a and the gas supply channel 36. The flow rate of the oxygen gas supplied from the oxygen gas supply section 37 to the upper electrode 33 is controlled by means of valve position adjustment of the first flow control vale 40. The fluorine-based gas supply section 38 is filled with a fluorine-based gas; e.g., sulfur hexafluoride ($SF_6$) or the like. When the second on-off valve 41 is opened (the first on-off valve 39 is closed), the fluorine-based gas is supplied to the upper electrode 33 by way of the second branch channel 36b and the gas supply channel 36. The flow rate of the fluorine-based gas supplied from the fluorine-based gas supply section 38 to the upper electrode 33 is controlled by means of valve position adjustment of the second flow control valve 42.

A flat-plate-shaped porous plate 33a is provided on the lower surface of the upper electrode 33. The oxygen gas or the fluorine-based gas supplied by way of the gas supply channel 36 is uniformly sprayed over the upper surface of the lower electrode 32 by way of this porous plate 33a.

Figure 3A:
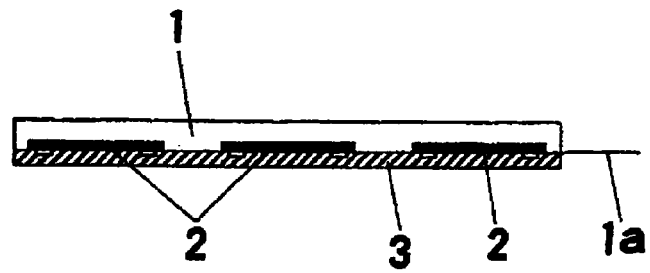
FIGS. 3A to 3D are descriptive views of steps of the semiconductor chip manufacturing method according to the embodiment of the present invention.

The method for manufacturing a semiconductor chip will now be described by reference to FIGS. 3, 4, and 5. In FIG. 3A, a plurality of semiconductor elements 2 are fabricated in a circuit pattern formation surface 1a of the semiconductor wafer 1. The wafer is in a state where a plurality of semiconductor chips are separated, so long as boundary sections among the adjacent semiconductor elements 2 are cut.

In order to fabricate semiconductor chips from this semiconductor wafer 1, a sheet-shaped adhesive UV tape 3 is first affixed to the circuit pattern formation surface 1a of the semiconductor wafer 1 (an UV tape affixing step S1 shown in FIG. 5), as shown in FIG. 3A. This UV tape 3 is provided for preventing separation of the semiconductor chips apart from each other, which would otherwise arise when the semiconductor wafer 1 is finally diced into semiconductor chips.

Figure 3B:
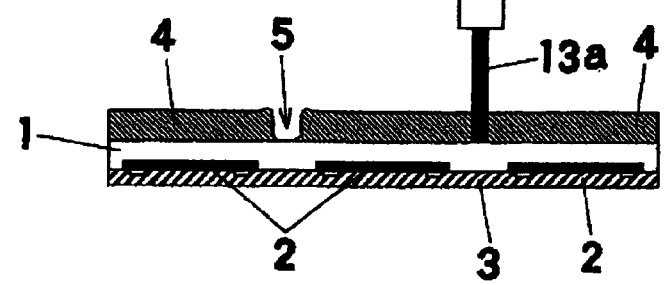

After the UV tape 3 has been affixed to the circuit pattern formation surface 1a of the semiconductor wafer 1, the resist film 4 is formed on one surface of the semiconductor wafer 1 (a resist film formation step S2 shown in FIG. 5), as shown in FIG. 3B. In the present embodiment, the resist film 4 is formed on the surface of the semiconductor wafer 1 opposite to its circuit pattern formation surface 1a. This resist film 4 is formed from a material resistant to the fluorine-based gas plasma; for example, aluminum, a resin, or the like. When aluminum is used, a vacuum deposition method, a method for affixing an aluminum-foil film, or the like, is used. When resin is used, a method for affixing a resin formed into the shape of a film, a method for applying a liquid resin by means of spin coating, or the like, is used.

Figure 3C:
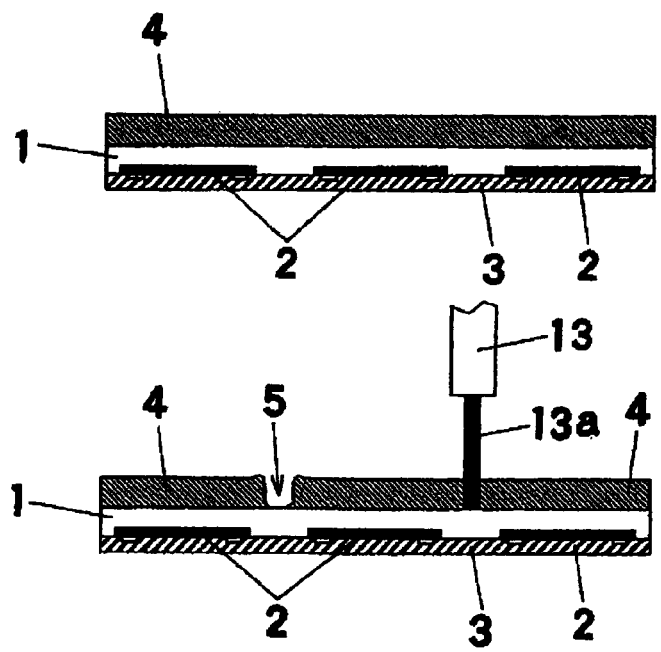
Figure 3D:
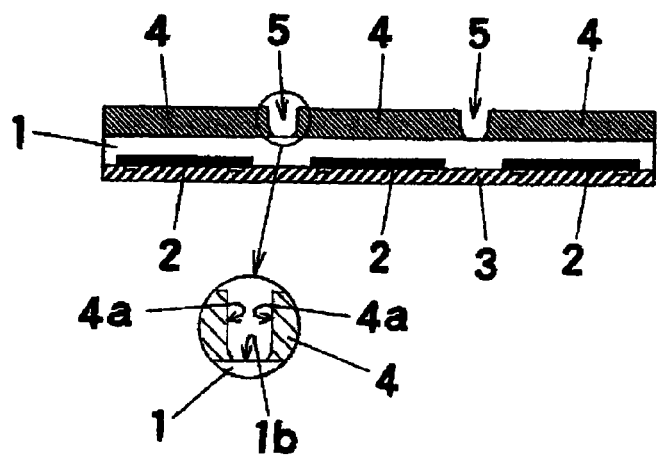

After the resist film 4 has bee formed on one surface of the semiconductor wafer 1, the semiconductor wafer 1 is set in the wafer holding section 11 of the laser processing system 10. As shown in FIGS. 3C and 3D, the laser beam 13a is radiated onto the boundary sections between the semiconductor elements 2 of the resist film 4 (spaces between the adjacent semiconductor elements 2), to thus eliminate the resist film 4 from the boundary sections. Thereby, boundary grooves 5 for partitioning the semiconductor elements 2 from each other are formed in the resist film 4 (a laser processing step S3 shown in FIG. 5).

Laser processing is performed while the laser beam 13a is being moved relatively with reference to the semiconductor wafer 1. Data pertaining to the positions of the boundary grooves 5 are stored in a work data storage section 20 of the laser processing system 10. In accordance with the data stored in this work data storage section 20, the control section 17 moves the laser emission section 13. Specifically, the control section 17 compares the target position of the laser beam 13a acquired by way of the camera 14 and the recognition section 18 with data pertaining to the positions of the boundary grooves 5 stored in the work data storage section 20, thereby moving the movement mechanism 15 such that the target position of the laser beam 13a moves over the boundary grooves 5 stored in the work data storage section 20. Further, data pertaining to widths of the boundary grooves 5 are also stored in the work data storage section 20. When emitting the laser beam 13a from the laser emission section 13, the control section 17 adjusts a beam size of the laser beam 13a by means of changing an output of the laser emission section 13, thereby rendering the width of the boundary groove 5 to be actually formed slightly narrower than the width of the boundary groove 5 stored in the work data storage section 20.

After completion of processing pertaining to the laser processing step S3, the semiconductor wafer 1 is removed from the wafer holding section 11 of the laser processing system 10 and carried in the vacuum chamber 31 of the plasma processing system 30. The thus-carried semiconductor wafer 1 is then fixed on the upper surface of the lower electrode 32 (a wafer-carrying-in step S4 shown in FIG. 5). At this time, the surface of the semiconductor wafer 1 on which the resist film 4 is formed is oriented upwardly.

Figure 6A:
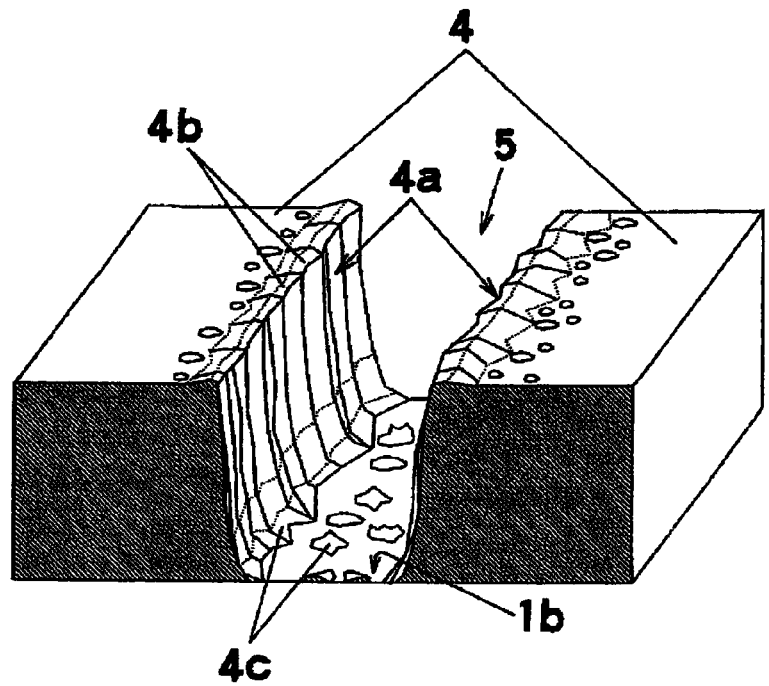
FIGS. 6A and 6B show the manner of changes arising in the surface of a boundary groove before and after a boundary-groove-surface smoothing step of the semiconductor chip manufacturing method according to the embodiment of the present invention.

In this step, the surfaces of the laser-processed boundary grooves 5 assume a scored, sharply-pointed, irregular shape. Here, the word "surfaces of the boundary grooves 5" denotes two mutually-opposing cut surfaces 4a of the resist film 4 created by cutting the resist film 4 by means of the laser beam 13a as well as a surface 1b of the semiconductor wafer 1 uncovered in the boundary groove 5 between these two cut surfaces 4a (see a partially-enlarged view shown in FIG. 3D). The reason why the surfaces of the boundary grooves 5 become scored and irregular is that irregularities 4b are formed on the cut surfaces 4a of the resist film 4 as a result of the resist film 4 having been cut by means of the pulsating laser beam 13a; that residues 4c having splashed around surroundings at the time of cutting of the resist film 4 adhere to the surfaces of the boundary grooves 5; and the like (FIG. 6A).

When processing pertaining to a plasma etching step S6 (FIG. 5) to be described later is performed in this state, side surfaces of the separated semiconductor chips also assume scored shapes, and the scored surfaces are prone to stress concentration. Therefore, when the semiconductor wafer 1 has been conveyed in the vacuum chamber 31, the irregular surfaces of the boundary grooves 5 scored in the laser processing step S3 are smoothed by means of plasma of the oxygen gas generated in the vacuum chamber 31 before being subjected to plasma etching (a boundary-groove-surface smoothing step S5 shown in FIG. 5).

Figure 4A:
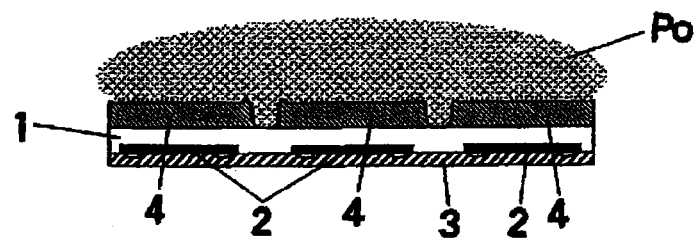
FIGS. 4A to 4F are descriptive views of steps of the semiconductor-chip manufacturing method according to the embodiment of the present invention.
Figure 4B:
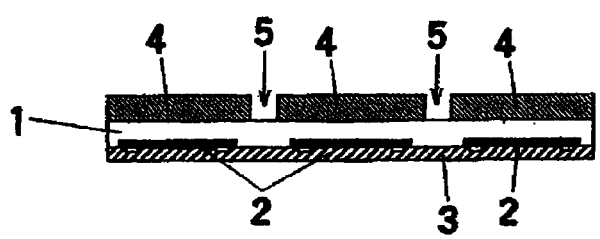

In the boundary-groove-surface smoothing step S5, the first on-off valve 39 is opened while the second on-off valve 41 of the plasma processing system 30 is closed, thereby supplying an oxygen gas from the oxygen gas supply section 37 to the upper electrode 33. Thereby, the oxygen gas is sprayed over the upper surface of the semiconductor wafer 1 from the upper electrode 33 by way of the porous plate 33a. The high-frequency power supply section 34 is driven in this state, to thus apply a high-frequency voltage to the lower electrode 32, whereby plasma Po of oxygen gas is generated between the lower electrode 32 and the upper electrode 33 (FIG. 4A). Since the plasma Po of oxygen gas incinerates the resist film 4 that is an organic substance, the surfaces of the boundary grooves 5 are smoothed (FIGS. 4B and 6B).

Figure 6B:
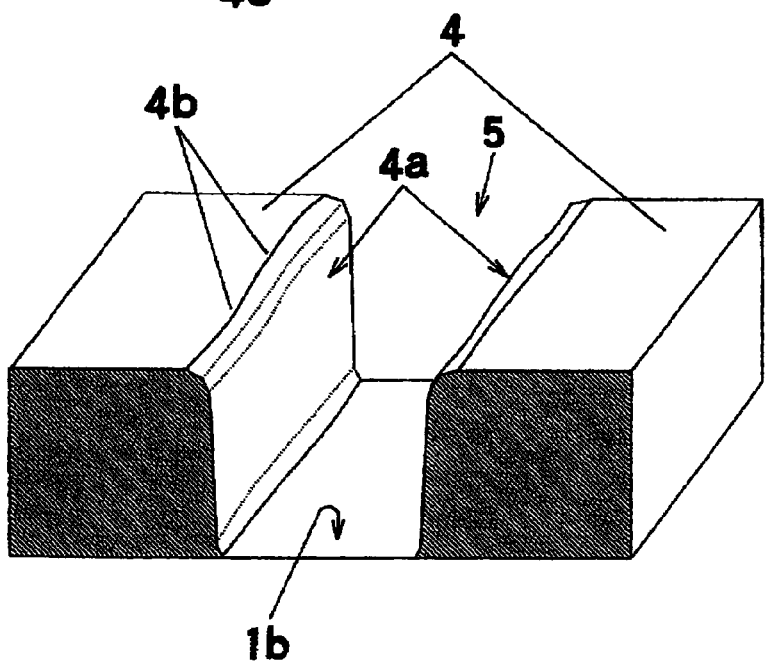

Specifically, the surfaces of this boundary groove 5 are smoothed by means of eliminating the irregularities 4b on the surfaces (the mutually-opposing two cut surfaces 4a of the resist film 4) of the boundary grooves 5 through use of the plasma Po of oxygen gas (or a gas mixture containing an oxygen gas as a primary ingredient); and smoothing the irregularities 4b on the surface of the boundary grooves 5 (the mutually-opposing two cut surfaces 4a of the resist film 4), to thus increase the irregularity period between the irregularities 4b (see FIG. 6B). While the surfaces of the boundary grooves 5 are being smoothed by means of the plasma of oxygen gas, the cooling unit 35 is driven, to thus circulate the coolant through the lower electrode 32 and prevent an increase in the temperature of the semiconductor wafer 1, which would otherwise be caused by the heat of the plasma.

The longer a period of time during which the resist film 4 is exposed to the plasma Po of oxygen gas, the greater extent incineration of the resist film 4 proceeds. The time during which the resist film 4 is exposed to the plasma Po of oxygen gas in this boundary-groove-surface smoothing step S5 is assumed to be the minimum period of time required to smooth the surfaces of the boundary grooves 5 of the resist film 4. As a guide, an exposure time during which the surface of the resist film 4 is removed by about 1 to 3 μm is preferable.

Figure 5:
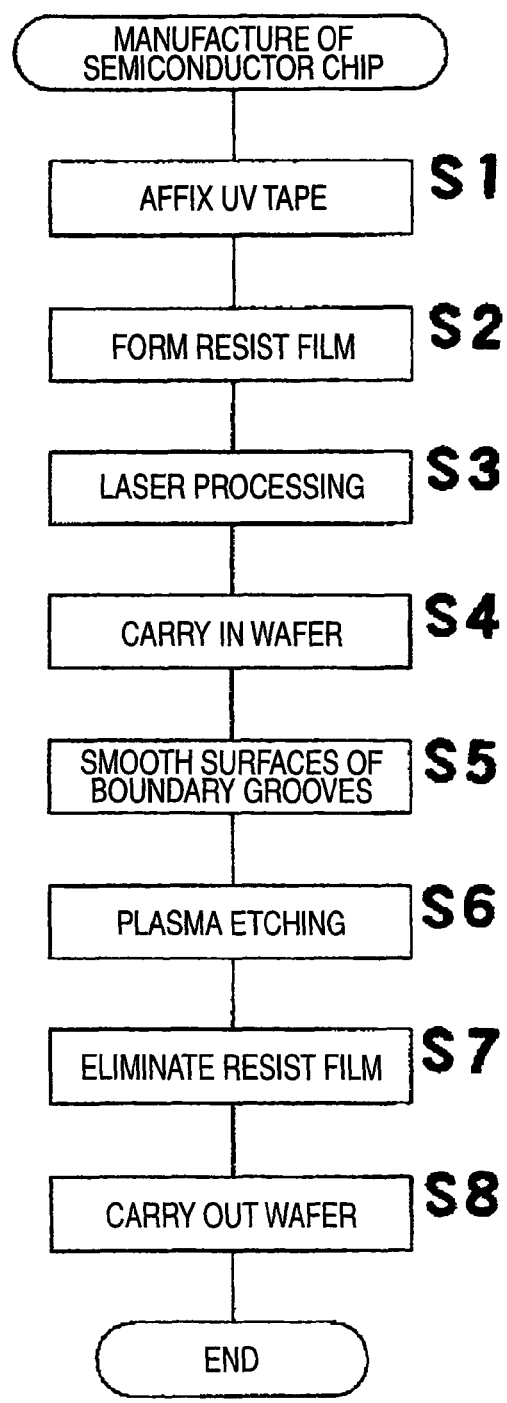
FIG. 5 is a flowchart showing the flow of the steps of the semiconductor chip manufacturing method according to the embodiment of the present invention.

After smoothing of the surfaces of the boundary grooves 5 has been completed, there is now performed plasma etching for dicing the semiconductor wafer 1 along the boundary grooves 5 into individual semiconductor chips by means of plasma of fluorine-based gas (a plasma etching step S6 shown in FIG. 5).

Figure 4C:
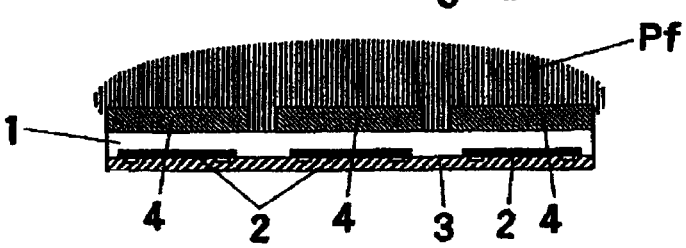

In the plasma etching step S6, the second on-off valve 41 is first opened while the first on-off valve 39 has been switched from the ON position to the OFF position, thereby supplying a fluorine-based gas from the fluorine-based gas supply section 38 to the upper electrode 33. As a result, the fluorine-based gas is sprayed over the upper surface of the semiconductor wafer 1 from the upper electrode 33 by way of the porous plate 33a. The high-frequency power supply section 34 is driven in this state, to thus apply a high-frequency voltage to the lower electrode 32, whereupon plasma Pf of fluorine-based gas develops between the lower electrode 32 and the upper electrode 33 (FIG. 4C).

Figure 4D:
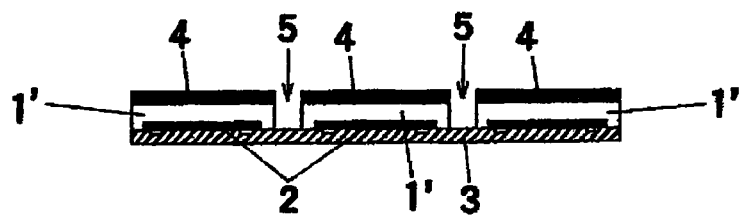
Figure 4E:
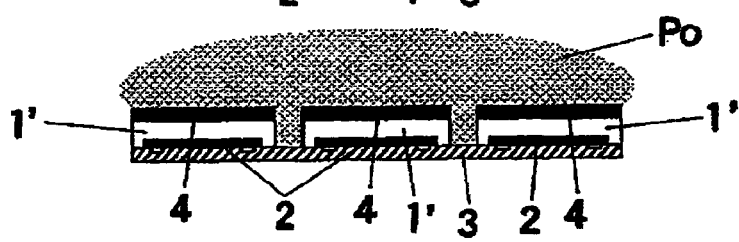

The surface 1b of the semiconductor wafer 1—which is made of silicon and uncovered in the boundary groove 5—is etched by means of the thus-generated plasma Pf of fluorine-based gas. Hence, the semiconductor wafer 1 is sliced along the boundary grooves 5 by one operation, whereby a plurality of semiconductor chips 1' are created (FIG. 4D). At this time, since the surfaces of the boundary grooves 5 have already been smoothed in the preceding step (the boundary-groove-surface smoothing step S5), the cut surfaces of the semiconductor wafer 1 formed by plasma etching; namely, the side surfaces of the semiconductor chips 1', become flat. While the surface 1b of the semiconductor wafer 1 is being etched by means of the plasma Pf of fluorine-based gas, the cooling unit 35 is driven, to thus circulate the coolant through the lower electrode 32 and prevent an increase in the temperature of the semiconductor wafer 1, which would otherwise be caused by the heat of the plasma.

Figure 4F:
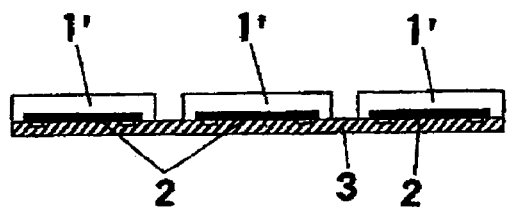

After completion of processing pertaining to the plasma etching step S6, the plasma Po of oxygen gas is generated in the vacuum chamber 31 along procedures analogous to those employed in the boundary-groove-surface smoothing step S5 (FIG. 4E), thereby incinerating and eliminating the resist film 4 still remaining on the upper surface of the semiconductor wafer 1 (in a state where the respective separated semiconductor chips 1' are connected together by means of the UV tape 3) (a resist film elimination step S7 shown in FIGS. 4F and 5).

In this resist film elimination step S7, there is a necessity for exposing the semiconductor wafer 1 to the plasma Po of oxygen gas until the resist film 4 still remaining on the surface is completely incinerated and eliminated. The time during which the semiconductor wafer 1 is exposed to the plasma Po of oxygen gas becomes longer than the time during which the semiconductor wafer 1 is exposed to the plasma Po of oxygen gas in the boundary-groove-surface smoothing step S5 (the time is about ten times the exposure time required in the boundary-groove-surface smoothing step S5). While the resist film 4 is being incinerated and eliminated by means of the plasma Po of oxygen gas in this resist film elimination step S7, the cooling unit 35 is driven, to thus circulate the coolant through the lower electrode 32 and prevent occurrence of an increase in the temperature of the semiconductor wafer 1, which would otherwise be caused by the heat of the plasma.

After the resist film 4 has been incinerated and eliminated completely, the semiconductor wafer 1 (in a state where the separated semiconductor chips 1' are connected together by means of the UV tape 3) is transported off from the inside of the vacuum chamber 31 (a wafer-carrying-out step S8 shown in FIG. 5). After the semiconductor wafer 1 has been carried out of the vacuum chamber 31, the UV tape 3 affixed to the circuit pattern formation surface 1a of the semiconductor wafer 1 is stretched, thereby enabling the separated semiconductor chips 1' to come apart. Subsequently, when the UV tape 3 is exposed to UV rays, the UV tape 3 induces photochemical reaction, thereby losing adhesive strength. As a result, the semiconductor chips 1' can be readily peeled off from the UV tape 3.

As mentioned above, under the method for manufacturing a semiconductor chip according to the present embodiment, the boundary sections among the semiconductor elements 2 of the resist film 4 are exposed to the laser beam 13a, to thus create, in the resist film 4, the boundary grooves 5 which partition the semiconductor elements 2 from each other. After the surface 1b of the semiconductor wafer 1 has been uncovered in the boundary grooves 5, the semiconductor wafer is subjected to etching through use of the plasma of the fluorine-based gas, thereby separating the semiconductor wafer 1 into the individual semiconductor chips 1' along the boundary grooves 5. However, the surfaces of the boundary grooves 5 which have assumed the irregular shape in the laser processing step S3 are smoothed by means of the plasma of the oxygen gas (or a gas mixture containing oxygen as a primary ingredient) before the semiconductor wafer is subjected to etching by means of the plasma of fluorine-based gas. Therefore, the cut surfaces of the semiconductor wafer 1 created through plasma etching; namely, side surfaces of the separated semiconductor chips 1', can be smoothed. The chipping-free, hard-to-crack semiconductor chips 1' can be manufactured.

As shown in FIG. 5, the method for manufacturing a semiconductor chip can be viewed as a method for processing the semiconductor wafer 1 in sequence of the resist film formation step S2, the laser processing step S3, the wafer-carrying-in step S4, the boundary-groove-surface smoothing step S5, the plasma etching step S6, and the wafer-carrying-out step S8. Moreover, the method can also be viewed as a method for processing the semiconductor wafer 1 in which processing pertaining to the resist film elimination step S7 is performed between the plasma etching step S6 and the wafer-carrying-out step S8. Even under such a method for processing the semiconductor wafer 1, the chipping-free, hard-to-crack semiconductor chips 1' can be manufactured.

Moreover, as shown in FIG. 5, the chipping-free, hard-to-crack semiconductor chips 1' can also be manufactured even under the method for processing the semiconductor wafer 1 in sequence of the resist film formation step S2, the laser processing step S3, the wafer-carrying-in step S4, the boundary-groove-surface smoothing step S5, the plasma etching step S6, and the wafer-carrying-out step S8. Further, the chipping-free, hard-to-crack semiconductor chips 1' can also be manufactured even under the method for processing the semiconductor wafer 1 in which processing pertaining to the resist film elimination step S7 is performed between the plasma etching step S6 and the wafer-carrying-out step S8.

Although the preferred embodiment of the present invention has been described thus far, the present invention is not limited to the previously-described embodiment. For instance, in the previous embodiment, the resist film 4 is formed on the surface of the semiconductor wafer 1 opposite its circuit pattern formation surface 1a. However, the resist film 4 may also be formed on the circuit pattern formation surface 1a of the semiconductor wafer 1. However, in the case where the resist film 4 is formed on the circuit pattern formation surface 1a of the semiconductor wafer 1, there is a potential of a protective film-which is provided on the surfaces of the semiconductor elements 2 and formed from an organic substance-being damaged when the resist film 4 is removed by means of the plasma of oxygen or the plasma of the gas mixture containing oxygen as a primary ingredient. As described in connection with the previous embodiment, forming the resist film 4 on the surface of the semiconductor wafer 1 opposite to its circuit pattern formation surface 1a rather than on the circuit pattern formation surface 1a of the semiconductor wafer 1 is preferable.

INDUSTRIAL APPLICABILITY

Cut surfaces of a semiconductor wafer created by means of plasma etching; namely, side surfaces of separated semiconductor chips, can be smoothed, and chipping-free, hard-to-crack semiconductor chips can be manufactured.

The invention claimed is:

1. A method for manufacturing a semiconductor chip, comprising:
a resist film formation step of forming a resist film on one surface of a semiconductor wafer in which a plurality of semiconductor elements are fabricated;
a laser processing step of emitting a laser beam to boundary sections among the semiconductor elements of the resist film, to form in the resist film boundary grooves which partition the semiconductor elements from each other and to uncover a surface of the semiconductor surface in the boundary grooves; and
a plasma etching step of etching the surface of the semiconductor wafer exposed in the boundary grooves by means of plasma of fluorine-based gas, to thus separate the semiconductor wafer into individual semiconductor chips along boundary grooves of the semiconductor wafer,
wherein, after the laser processing step and before the plasma etching step, it is performed a boundary-groove-surface smoothing step for smoothing irregular surfaces of the boundary grooves generated in the laser processing step by means of plasma of oxygen gas or plasma of gas mixture containing oxygen as a primary ingredient.

2. The method for manufacturing a semiconductor chip according to claim 1, wherein in the boundary-groove-surface smoothing step, irregularities on the surfaces of the boundary grooves are removed through use of the plasma of oxygen gas or the plasma of gas mixture containing oxygen as a primary ingredient.

3. The method for manufacturing a semiconductor chip according to claim 1, wherein in the boundary-groove-surface smoothing step, residues of the resist film adhering to the surfaces of the boundary grooves are removed through use of the plasma of oxygen gas or the plasma of gas mixture containing oxygen as a primary ingredient.

4. The method for manufacturing a semiconductor chip according to claim 1, wherein in the boundary-groove-surface smoothing step, irregularities on the surfaces of the boundary grooves are smoothened through use of the plasma of oxygen gas or the plasma gas mixture containing oxygen as a primary ingredient, to thus decrease the occurrence of irregularities.

5. The method for manufacturing a semiconductor chip according to any one of claims 1 through 4, wherein processing pertaining to a resist film elimination step for eliminating the resist film through use of the plasma of oxygen gas or the plasma of gas mixture containing oxygen as a primary ingredient is performed subsequent to the plasma etching step.

6. The method for manufacturing a semiconductor chip according to any one of claims 1 through 4, wherein the resist film is formed on a surface of the semiconductor wafer opposite to its circuit pattern formation surface in which the semiconductor elements are fabricated.

7. A method for processing a semiconductor wafer, comprising:
a resist film formation step of forming a resist film on one surface of a semiconductor wafer in which a plurality of semiconductor elements are fabricated;
a laser processing step of emitting a laser beam to boundary sections among the semiconductor elements of the resist film, to thus form in the resist film boundary grooves which partition the semiconductor elements from each other and to uncover a surface of the semiconductor surface in the boundary grooves;
a wafer-carrying-in step of transporting the semiconductor wafer having undergone processing pertaining to the laser processing step into a vacuum chamber of a plasma processing system;
a boundary-groove-surface smoothing step of smoothing irregular surfaces of the boundary grooves generated in the laser processing step, by means of plasma of oxygen gas or plasma of gas mixture containing oxygen as a primary ingredient;
a plasma etching step of etching, subsequent to the boundary-groove-surface-smoothing step, the uncovered surface of the semiconductor wafer in the boundary grooves by means of plasma of fluorine-based gas, to thus separate the semiconductor wafer into individual semiconductor chips along boundary grooves of the semiconductor wafer; and a wafer-carrying-out step of transporting the semiconductor wafer having undergone processing pertaining to the plasma etching step from the vacuum chamber.

8. The method for processing a semiconductor wafer according to claim 7, wherein processing pertaining to a resist film elimination step of eliminating the resist film through use of plasma of oxygen gas or plasma of gas mixture containing oxygen as a primary ingredient, which is generated in the vacuum chamber, is performed between the plasma etching step and the wafer-carrying-out step.

* * * * *